(12) United States Patent
Sasakawa et al.

(10) Patent No.: US 8,529,704 B2
(45) Date of Patent: Sep. 10, 2013

(54) VACUUM PROCESSING APPARATUS AND OPERATING METHOD FOR VACUUM PROCESSING APPARATUS

(75) Inventors: Eishiro Sasakawa, Nagasaki (JP); Masahiro Sakaki, Nagasaki (JP); Shigekazu Ueno, Nagasaki (JP); Keisuke Kawamura, Nagasaki (JP); Akemi Takano, Nagasaki (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 323 days.

(21) Appl. No.: 12/864,624

(22) PCT Filed: Jun. 27, 2008

(86) PCT No.: PCT/JP2008/061728
§ 371 (c)(1),
(2), (4) Date: Aug. 11, 2010

(87) PCT Pub. No.: WO2009/157084
PCT Pub. Date: Dec. 30, 2009

(65) Prior Publication Data
US 2010/0310785 A1    Dec. 9, 2010

(51) Int. Cl.
*B08B 5/04* (2006.01)

(52) U.S. Cl.
USPC .......................... 134/21; 134/18; 134/22.18

(58) Field of Classification Search
None
See application file for complete search history.

(56) References Cited

U.S. PATENT DOCUMENTS 6,060,397 A    5/2000    Sseamons et al.

2003/0097987 A1    5/2003    Fukuda
2005/0242061 A1    11/2005    Fukukda

FOREIGN PATENT DOCUMENTS

| JP | 5-259083 A | 10/1983 |
|---|---|---|
| JP | 8-31752 A | 2/1996 |
| JP | H09-232299 | 9/1997 |
| JP | H09-275076 | 10/1997 |
| JP | 11-102897 A | 4/1999 |
| JP | 11-176714 A | 7/1999 |
| JP | 2001-123271 A | 5/2001 |
| JP | 2002-057110 A | 2/2002 |
| JP | 2002-093719 A | 3/2002 |
| JP | 2002-212734 A | 7/2002 |
| JP | 2003-158281 | 5/2003 |
| JP | 2003-163208 | 6/2003 |
| JP | 2003-264152 | 9/2003 |
| JP | 2004-064018 A | 2/2004 |
| JP | 2005-150258 A | 6/2005 |
| JP | 2005-232490 | 9/2005 |
| JP | 2005-330566 A | 12/2005 |
| JP | 2006-313934 A | 11/2006 |
| JP | 2007-084908 A | 4/2007 |
| JP | 2008-240034 A | 10/2008 |

OTHER PUBLICATIONS

Japan Patent Office, "Office Action for JP 2011-231741", Jul. 9, 2013.

*Primary Examiner* — Eric Golightly
(74) *Attorney, Agent, or Firm* — Manabu Kanesaka; Kenneth M. Berner; Benjamin J. Hauptman

(57) ABSTRACT

An operation method for cleaning a vacuum processing apparatus includes feeding a cleaning gas into a film deposition chamber of the vacuum processing apparatus when a predetermined number of batches of film deposition process is finished. The predetermined number of batch of film deposition processes is calculated based on a film deposition-related operating time (a film deposition time and a film deposition preparation time) and a cleaning-related operating time (a cleaning procedure time, a cleaning procedure preparation time, and a pre-deposition film deposition time).

6 Claims, 5 Drawing Sheets

SELF-CLEANING PROCEDURE IMPLEMENTATION PERIOD

VACUUM PROCESSING APPARATUS AND OPERATING METHOD FOR VACUUM PROCESSING APPARATUS

RELATED APPLICATIONS

The present application is National Phase of International Application No. PCT/JP2008/061728 filed Jun. 27, 2008, the disclosure of which is hereby incorporated by reference herein in its entirety.

TECHNICAL FIELD

The present invention relates to a vacuum processing apparatus and an operating method for a vacuum processing apparatus, and in particular, relates to a vacuum processing apparatus that performs processing on a substrate by using a plasma, and an operating method for the same.

BACKGROUND ART

Conventionally, thin-film deposition in semiconductors, electronic components, and solar cells and the like uses a vacuum processing apparatus that carries out processing on a substrate by using a plasma.

Examples of such vacuum processing apparatuses include film depositing apparatuses, plasma CVD (Chemical Vapor Deposition) apparatuses, dry etching apparatuses, and sputtering apparatuses.

For example, in the case in which film deposition of an amorphous silicon or a microcrystalline silicon or the like is carried out on a substrate in a plasma CVD apparatus, a film deposited and is deposited on portions other than the substrate (for example, the discharge electrode, the counter electrode, substrate holding fixture, electrode cover and the like, which are referred to hereinbelow as the "film deposition unit members") that face toward the plasma generated inside a film deposition chamber.

When their film becomes thick, there is a concern that, for example, the film will separate due to thermal expansion differences caused by temperature changes inside the film deposition chamber during the film deposition process for each substrate, and that this film will be mixed into the film that is being formed on the substrate causing a deterioration of the film deposition quality, or a concern that particles that hinder film deposition will be produced. When this type of situation occurs, defective products increase, and thus, the processing capacity of the film deposition apparatus decreases.

Because of this, the film deposition operation is suspended, and a cleaning that removes the film that has formed inside the film deposition chamber is performed.

During this cleaning, normally the film deposition apparatus is left open in the atmosphere and the film deposition unit members inside the film deposition chamber, on which a film has deposited, are manually replaced with replacement components that have had the film removed by washing at a separate location. However, besides the replacement operation for necessary components, in order to open the apparatus to the air, there is a problem in that time and labor are consumed in order to lower the temperate of the substrate heater, to break the vacuum, to raise the temperature again, and to draw a vacuum again.

As a method for eliminating this problem, for example, a self-cleaning procedure has been proposed in which a cleaning gas that includes fluorine is introduced into the film deposition chamber, a fluorine radical (F) is produced by a plasma, and this fluorine radical (F) removes the film by etching (refer to patent document 1 and patent document 2).

In this case as well, reducing the self-cleaning procedure time is necessary in order to improve the processing capacity of the film deposition processing apparatus, and thus, measures to improve the cleaning speed at which film is removed by etching is treated as a key problem. In addition, with respect to the self-cleaning procedure operation, performing the self-cleaning procedure after a plurality of film deposition operations has been proposed.

The invention disclosed in patent document 1 performs self-cleaning procedure at various film thicknesses, finds continuously processable integrated film thicknesses in a range in which the temperature of the discharge electrode (which is also serves as a supply means for the film-depositing gas) opposed to the substrate is between 200° C. and 400° C., and determines the self-cleaning procedure cycle by dividing this integrated film thickness by an upper limiting value of the substrate film deposition thickness. Specifically, the self-cleaning procedure is performed every eleven sheets (an integrated film thickness of 11 µm) so that contamination by impurities does not occur.

In addition, the invention disclosed in patent document 2 discloses carrying out cleaning after CVD procedure has been performed "n" times, where "n" indicates a state lower than than a predetermined total particle threshold limit, a state higher than a predetermined uniformity limit, or an upper limit to the number of processes that a CVD apparatus can have in operation within a predetermined deposition rate.

In a specific example of cleaning residual material from a CVD apparatus, "n" is in a range of about 1 to 50, preferably 2 or greater, and more preferably 10 or greater.

A substrate is conveyed into a film deposition chamber that is provided with a particle counter before the film deposition operation, and after preparatory operation is performed, the number of particles on the substrate is measured. As a result of the measurement, this "n" is set in a range in which the particles remain within a predetermined number of particles.

Alternatively, "n" is set in a range in which the fluctuation in the film deposition thickness remains within a predetermined range (a predetermined uniformity).

[Patent Document 1]
Japanese Unexamined Patent Application, First Publication No. 2003-163208
[Patent Document 2]
Japanese Unexamined Patent Application, First Publication No. H9-232299

However, the inventions disclosed in patent document 1 and patent document 2 lack general applicability in that, for example, both set the time interval between the self-cleaning procedures after performing preparatory operations, and thus, this setting consumes time, and in addition, the setting must be calibrated again each time the film deposition conditions change.

In addition, in order to suppress explosive reactions due to a film deposition source gas coming into direct contact with the cleaning gas, the gas supply system piping lines and the exhaust piping lines must be purged and switched. Because this operation requires time, the self-cleaning procedure operating time increases. Thereby, in order to appropriately adjust the cleanliness inside the film deposition chamber and the self-cleaning procedure frequency, a judgment is necessary based on the operation conditions experimentally obtained by repeatedly implementing the self-cleaning procedure trials.

In addition, although improvements in the self-cleaning procedure methods can be seen that are due, for example, to adjusting the location for feeding the cleaning gas in order to increase the time interval between the self-cleaning procedures, these cannot be said to be sufficient, and further improvement is required.

In particular, for example, in an apparatus such as a thin-film solar cell, in which the films that are formed are thick in comparison to the films that are formed during the manufacture of a TFT for a liquid crystal display, the self-cleaning procedure must be performed on a thick film that is deposited inside a film deposition chamber after performing film deposition processing a plurality of times, and thus, in order to increase the operating time of the vacuum processing apparatus, the self-cleaning procedure time must be reduced. Thus, because the amount of cleaning gas and amount of the etching reaction applied to the deposited film per unit of time become large, the amount of heat energy that is generated during the self-cleaning procedure becomes large, and the temperature of the film deposition unit members inside the film deposition chamber rises rapidly. In particular, in the case in which the self-cleaning procedure is performed at an etching rate of several nm/s or greater, the amount of heat energy that is generated cannot be decreased, and generally during the manufacturing of a thin film solar cell, the self-cleaning procedure operation is a difficult problem, and the timing for suitable self-cleaning procedure becomes extremely important.

In consideration of the problems described above, it is an object of the present invention to provide a vacuum processing apparatus that can set a time interval for performing self-cleaning procedure simply and so as to have general-use applicability, and furthermore, can further increase the time interval between self-cleaning procedures and can improve production efficiency, and an operating method therefore.

DISCLOSURE OF INVENTION

In order to solve the problems described above, the present invention uses the following solutions as a method for setting a time interval between self-cleaning procedures that is suitable for mass production apparatuses.

Specifically, a first aspect of the present invention is a vacuum processing apparatus that performs a self-cleaning procedure by feeding a cleaning gas into a film deposition chamber in which film deposition processing is performed on a substrate, wherein a timing interval between self-cleaning procedures is set in a range in which a film deposition operating time ratio is converged with respect to an increase in the film deposition processing amount, where the film deposition operating time ratio is represented by a proportion of a film deposition-related operating time in the sum of the film deposition-related operating time, which includes a film deposition time and a film deposition preparation time, and a cleaning-related operating time, which includes a self-cleaning procedure time, a self-cleaning procedure preparation time, and a pre-deposition film deposition time.

The film deposition-related operating time is the total of, for example, the film deposition time during which the film deposition process is performed, and the film deposition preparation time that includes the substrate conveying time and the preparation time before and after film deposition. Thus, the film deposition-related operating time increases substantially in proportion to an increase in the amount of film deposition processing. In contrast, the cleaning-related operating time is the time resulting from totaling, for example, the self-cleaning procedure time accompanying the etching reaction applied to the deposited film, the self-cleaning procedure preparation time, which includes switching the gas system and performing adjustments such that the portions other than the substrate that face a plasma generated inside the film deposition chamber are at the temperature used during film deposition, and the pre-deposition film deposition time required to form an pre-deposition film.

When the amount of the film deposition processing increases, the integrated thickness of the deposited film that forms on locations other than the substrate inside the film deposition chamber (for example, the discharge electrode, the counter electrode, the substrate holding fixtures, the electrode cover and the like; hereinbelow, these are also referred to as the "film deposition unit members") also increases substantially in proportion to the film deposition-related operating time. Thus, because the integrated thickness of the deposited film that is removed increases substantially in proportion to the film deposition-related operating time, the self-cleaning procedure time consumed by the etching reaction applied to the deposited film also increases substantially in portion to the film deposition-related operating time.

Here, the film deposition operating time ratio is defined as the proportion of the film-deposition related operating time in the sum of the film deposition-related operating time, which corresponds to the time for all operations of the vacuum processing apparatus in the film deposition-related operating time, and the cleaning-related operating time.

It is understood that by evaluating the film deposition operating time ratio, it is possible to appropriately evaluate that the cleaning-related time includes necessary time outside of the self-cleaning procedure time consumed by the etching reaction applied to the deposited film, and there is an extremely effective significance in determining the time interval between self-cleaning procedures. The film deposition operating time ratio forms what is referred to as a saturation curve that converges on a certain value when the film deposition-related operating time becomes unbounded by assuming that the film deposition processing amount is unbounded.

According to the present aspect, the time interval between self-cleaning procedures is set in a range in which the film deposition operating time ratio is saturated with respect to the increase in the film deposition processing amount, and thus, for example, it can be easily set by providing the film deposition-related operating time for one operation and the cleaning-related operating time, which is substantially proportional thereto Note that here, "saturated" denotes a state after the rate of increase of the ratio of the film deposition-related operating time with respect to the film deposition processing amount has decreased by ½ or less when the film deposition processing amount is small.

In addition, "saturated" denotes a state after 90% or more of the convergence value of the film deposition operating time ratio has been reached, and more preferably, a state after the 80% or more of the value of the film deposition operating time ratio has been reached when the film deposition processing amount becomes unbounded.

In addition, in the case in which the film deposition conditions change, that is, the film deposition-related operating time and the cleaning-related operating time that is substantially proportional thereto change, the time interval between self-cleaning procedures can be simply changed after a suitable determination, and thus, provides advantageous general-use applicability.

Furthermore, because the time interval between the self-cleaning procedures is set in a range in which the film deposition operating time ratio is saturated with respect to the increase in the film deposition amount, the cleaning-related operating time has little influence on the film deposition-related operating time. Thus, because the influence of the cleaning-related operating time becomes small, it is possible to stably improve the production efficiency of the vacuum processing apparatus.

In addition, in the aspect described above, it is advantageous to set the film deposition operating time ratio in a range exceeding 90% of the convergence value thereof.

In this manner, because the film deposition is performed in a range in which the film deposition operating time ratio exceeds 90% of the convergence value thereof, for example, when a silicon-based film is being formed, the time interval between self-cleaning procedure is set in a range in which the integrated film thickness of the amorphous silicon-based film exceeds 20 µm, or set in a range in which the integrated film thickness of a microcrystalline silicon-based film exceeds 50 µm.

In this manner, because a large film deposition processing amount can be set, the production efficiency of the vacuum processing apparatus can be improved.

Note that the integrated film thickness on a substrate denotes the number of substrates that have undergone processing multiplied by the thickness of a silicon-based film that has been formed by film deposition processing on one substrate. Thus, the integrated film thickness on the substrate is determined based on the fact that the silicon-based integrated film thickness on the film deposition unit members inside the film deposition chamber, starting with the discharge electrode, differs depending on the film deposition unit members and cannot be directly calculated.

In addition, in the self-cleaning procedure operation, considering the influence of heat generation during operation, which is a heat generation effect and in which the thickly deposited silicon-based film becomes easily separated due to temperature changes between film deposition processing steps, it is advantageous that the integrated film thickness does not exceed, for example, 500 µm.

Furthermore, "silicon-based" denotes being amorphous silicon-based or crystalline silicon-based, and silicon is a generic name that includes silicon (Si), silicon carbide (SiC), and silicon germanium (SiGe). "Crystalline silicon-based" denotes being amorphous silicon-based, that is, a silicon-based other than a non-crystalline silicon-based, and also includes being microcrystalline silicon-based and polycrystalline silicon-based.

In addition, in the aspect described above, a structure may be used in which a high heat capacity heat energy reservoir member is arranged inside the film deposition chamber.

In this manner, because the heat energy reservoir having a high heat capacity is arranged inside the film deposition chamber, the heat energy reservoir can absorb the heat generated during the self-cleaning procedure operation.

Note that here, the phrase "high heat capacity" denotes being at least higher than the heat capacity of the substrate.

When the heat energy reservoir absorbs an amount of the heat generated during the self-cleaning procedure operation, a rise in the temperature of the film deposition unit members inside the film deposition chamber due to the heat generation effect that accompanies the self-cleaning procedure operation can be ameliorated. In addition, there is an increase in the permitted integrated film thickness of the silicon-based deposited film on the film deposition unit members that can undergo an etching process at a temperature equal to or less than the permitted maximum temperature for each of the film deposition unit members inside the film deposition chamber, and thus, the time interval between self-cleaning procedure can be greatly increased.

In addition, in the structure described above, it is advantageous to use a discharge electrode that is arranged opposite to the substrate and an electrode cover that covers the discharge electrode are used as the heat energy reservoir. Alternatively, the heat energy reservoir may be provided in proximity to the electrode cover.

In this manner, heat can be stored at a portion where the heat that accompanies the self-cleaning procedure operation is principally generated, and thus, the heat storage efficiency can be greatly increased.

In addition, in the aspect described above, a structure may be used in which, after the completion of the self-cleaning procedure, a pre-deposition film deposition operation that forms a pre-deposition film having a high adhesion may be performed inside the film deposition chamber.

A nickel alloy material, a stainless steel material, or an aluminum material or the like is used for the film deposition unit members inside the film deposition chamber. A corrosion layer is produced on the surfaces of these film deposition unit members. The corrosion layer is produced by fluorine and fluorine radicals used in the etching reaction acting on the constituent material components of the surfaces. This corrosion layer develops due to carrying out self-cleaning procedure, and the silicon-based film that forms on the surfaces is readily separated from this corrosion layer portion. In addition, immediately after the completion of the self-cleaning procedure, particles adhere to the surface inside the film deposition layer due to the etching action. These particles include an iron (Fe) component, a chromium (Cr) component, and an aluminum (Al) component, which are portions of the constituent materials of the film deposition unit members. These components cause the plasma to become unstable when the film deposition process restarts.

According to this structure, after the completion of the self-cleaning procedure, because a highly adhesive pre-deposition film is formed on the surface inside the film deposition chamber, the pre-deposition film can ameliorate the effects of the corrosion layer and components such as iron, chrome, and aluminum and the like.

Thus, there is little separation because a silicon-based film that is integrally formed on the pre-deposition film having a high adhesion becomes integrally formed on the pre-deposition film, and thus, the time interval between self-cleaning procedures can be further increased by an amount in proportion to this. In addition, due to the pre-deposition film, the floating of particles including components such as iron, chrome, and aluminum and the like is suppressed, and the stability of the plasma can be improved. Thus, the efficiency of the film deposition operation can be improved.

In this case, it is advantageous for the pre-deposition film to have a film thickness that is, for example, equal to or greater than 200 nm and equal to or less than 3000 nm.

When the pre-deposition film layer is less than 200 nm, there is a concern that it will be insufficient to contain the corrosion layer, which gradually forms due to the components of iron and chrome and the like that adhere to the surface of the film deposition layer and due repeatedly performing self-cleaning procedure. When the pre-deposition film thickness exceeds 500 nm in an amorphous silicon film or exceeds 3000 nm in a microcrystalline silicon film, the pre-deposition film deposition takes a long time. At the same time, the amount of an integrated film layer that can be undergo film deposition processing is limited because of limits on the maximum integrated film thickness up to the point in time that the next self-cleaning procedure is carried out, and thus, the film deposition-related operating time becomes short.

In addition, in the above structure, it is advantageous that the pre-deposition film deposition operation be carried out such that the film deposition pressure be 1.0 to 1.5 times the film deposition pressure during the film deposition process, and that, at least in the initial film deposition period, the high frequency power supplied to the discharge electrode be 0.1 to 1.0 times the high frequency power during the film deposition process.

In this manner, the pre-deposition film deposition operation is carried out having a film deposition pressure that is 1.0 to 1.5 times the film deposition pressure during the film deposition process, and at least during the initial film deposition period up to the point in time that about 1/10 of the film thickness of the pre-deposition film has been formed, the radio frequency power that is supplied to the discharge electrode is implemented at 0.1 to 1.0 times the radio frequency power during the film deposition process. Thus, an pre-deposition film having a high adhesiveness can be formed inside the film deposition chamber.

Furthermore, in order to improve the adhesiveness, preferably the film deposition pressure during the pre-deposition film deposition operation is carried out at 1.0 to 1.2 times the film deposition pressure during film deposition process, and it is desirable that the radio frequency power during the initial period be 0.4 to 0.9 times the radio frequency power during the film deposition processing.

When the film deposition pressure is made higher than the film deposition pressure during film deposition process, more film deposition precursors arrive per unit time in comparison to the arrival per unit time during film deposition processing, and thus, the denseness of the pre-deposition film that has been formed improves. In contrast, when the film deposition pressure is made too high, the film deposition rate becomes high, and instead, the denseness is reduced.

In addition, when the high frequency power that is supplied to the discharge electrode is small in comparison to the high frequency power supplied during the film deposition process, the amount that is decomposed by the plasma becomes small, and thus, the deposition of the pre-deposition film proceeds slowly, and the density improves. At less than 0.1 times the high frequency power, the film deposition rate becomes slow, and the time for the pre-deposition film deposition operation becomes long. When the high frequency power is greater than 1.0 times, there is a concern that the initial film that is formed when the pre-deposition film starts to grow does not become dense in comparison to the film during the film deposition process.

In addition, in the structure described above, it is advantageous to suspend the pre-deposition film deposition operation at least one time and carry out high vacuum exhaust.

Components including an iron component, chrome component, and aluminum component and the like, which have desorbed from the constituent material due to reacting with fluorine and fluoride radicals, become microparticles and adhere to the surface of the film deposition unit members inside the film deposition chamber due to the self-cleaning procedure etching operation. In the initial stage of the pre-deposition film deposition operation, the microparticles that include components such as the iron, chrome, and aluminum and the like each readily float into the plasma singly or after ionizing by reacting with the film deposition gas.

During the pre-deposition film deposition operation, the pre-deposition film deposition is suspended at least one time, and high vacuum exhaust is carried out. Thus, the floating material inside the film deposition chamber at this point in time can be exhausted to the outside. When the floating material is exhausted to the outside, ionized components such as iron, chrome, and aluminum and the like that are included in the floating matter are also eliminated, and thus, it is possible to suppress these from being mixed into the pre-deposition film that is formed after the pre-deposition film deposition operation suspension. In addition, the ionized components such as iron, chrome, and aluminum and the like collect electrons in the plasma, and thereby, the plasma density is not reduced. Thus, an advantageous pre-deposition film can be formed.

Thereby, the time interval between self-cleaning procedures can be further lengthened.

Note that carrying out the suspension a higher number of times while high vacuum exhaust is being performed is preferable because more floating material will be exhausted from the film forming chamber to the outside. However, when considering the pre-deposition film deposition operation not being lengthened more than necessary, five or less suspensions while carrying out high vacuum exhaust is practical.

In addition, in this structure, inside the film deposition chamber, it is advantageous to machine the surface of the portions on which the pre-deposition film is formed so as to have a ten point average roughness equal to or greater than 0.1 μm and equal to or less than 5 μm, and a maximum height of 20 μm or less.

In this manner, inside the film deposition chamber, the surfaces of the film deposition unit members at the portion where the pre-deposition film is formed are machined so as to have a ten point average roughness (Rz) equal to or greater than 0.1 μm and equal to or less than 5 μm, and the maximum height is equal to or less than 20 μm. The detachment of microscopic convex portions and the separation of the corrosion layer can be effectively suppressed after the corrosion layer, which results from fluorine acting on the constituent materials of the film deposition unit members inside the film deposition chamber, has formed over all of the microscopic recesses on the surfaces of the film deposition unit member surfaces.

When the roughness of the surfaces of the film deposition unit members is equal to or greater than 5 μm, at the initial stage in the progress of the corrosion, overall microscopic convex shapes grow on the corrosion layer, and the microscopic convex portions easily detach, and thus, the apparent corrosion speed of the film deposition unit members becomes high, and the service life of the film deposition unit members becomes short. In addition, when the roughness of the film deposition unit member surfaces is equal to or less than 0.1 μm, the anchor effect, by which the pre-deposition film is formed, between the pre-deposition film and the film deposition unit members is reduced, and the pre-deposition film layer readily separates. In addition, performing machining so that the surfaces of the film deposition unit members have a ten point average roughness (Rz) equal to or greater than 1 μm and equal to or less than 5 μm and the maximum height is equal to or less than 10 μm is more preferable because the detachment of the corrosion layer and the separation of the pre-deposition film layer is prevented.

A second aspect of the present invention provides an operating method for a vacuum processing apparatus that performs self-cleaning procedure by feeding a cleaning gas into a film deposition chamber in which film deposition processing is performed on a substrate, wherein the self-cleaning procedure is performed in a range in which a film deposition operating time ratio is saturated with respect to an increase in the film deposition processing amount, where the film deposition operating time ratio is represented by the proportion of the film deposition-related operating time in the sum of the film deposition-related operating time, which includes the film deposition time and the film deposition preparation time, and the cleaning-related operating time, which includes the self-cleaning procedure time, the self-cleaning procedure preparation time, and the pre-deposition film deposition time.

The film deposition-related operating time increases substantially in proportion to the increase in the film deposition processing amount. In contrast, when the film deposition processing amount increases, the thickness of the film that is formed at locations outside the substrate inside the film deposition chamber also increases in substantial proportion to the film deposition-related operating time. Thus, because the thickness of the film that is removed increases in substantial portion to the film deposition-related operating time, the self-cleaning procedure time also increases in substantial proportion to the film deposition-related operating time.

Therefore, the film deposition operating time ratio forms what is referred to as a saturation curve that converges on a certain value when, assuming that the film deposition processing amount is unbounded, the film deposition-related operating time becomes unbounded, and where the film deposition operating time ratio is represented by the proportion of the film deposition-related operating time in the sum of the film deposition-related operating time, which includes the film deposition time and the film deposition preparation time, and the cleaning-related operating time, which includes the self-cleaning procedure time, the self-cleaning procedure preparation time, and the pre-deposition film deposition time.

According to the present aspect, because self-cleaning procedure is performed in a range in which the ratio of the film deposition-related operating time is saturated with respect to the increase in the film deposition processing amount, the performance timing can be easily determined by providing, for example, the film deposition-related operating time for one operation and the cleaning-related operating time (the self-cleaning procedure time, the self-cleaning procedure preparation operating time, and the pre-deposition film deposition time, which are substantially proportional to the film deposition-related operating time), which is substantially proportional thereto.

In addition, even when the film deposition conditions change, that is, the film deposition-related operating time and the cleaning-related operating time, which is substantially proportional thereto, change, the performance time interval between self-cleaning procedures can be easily changed.

Furthermore, because the self-cleaning procedure is performed in a range in which the ratio of the film deposition-related operating time is saturated with respect to the increase in the film deposition processing amount, the influence of the self-cleaning procedure operating time on the film deposition-related operating time is small. Thus, because the influence of the self-cleaning procedure operating time becomes small, the production efficiency of the vacuum processing apparatus can be stably improved.

In addition, in the above aspect, it is advantageous to implement the self-cleaning procedure in a range in which the film deposition operating time ratio exceeds 90% of the convergent value thereof.

In this manner, because the self-cleaning procedure is performed in a range in which the film deposition operating time ratio exceeds 80% of the convergent value thereof, when for example, a silicon based film is formed, the time interval between self-cleaning procedures is carried out in a range in which the integrated film thickness of an amorphous silicon based film exceeds 20 μm and in a range in which the integrated film thickness of a microcrystalline silicon-based film exceeds 50 μm. In this manner, because the integrated film can be made thick up to the point in time that self-cleaning procedure is performed, a large film deposition processing amount can be set, and the production efficiency can be improved.

Note that when considering the influence of heat generation during operation, including that the self-cleaning procedure operation is an exothermic action and that a silicon based film that has been made thicker readily separates because of temperature changes during the film deposition processing steps, it is advantageous that the integrated film deposition thickness not exceed, for example, 500 μm.

In addition in the present aspect, the heat amount that is generated during the self-cleaning procedure operation may be accumulated by a heat energy reservoir member, which has a high heat capacity, arranged inside the film deposition chamber.

In this manner, because the heat energy reservoir having a high heat capacity is arranged inside the film deposition chamber, the heat energy reservoir can absorb the amount of heat generated during the self-cleaning procedure operation.

Note that here, the phrase "high heat capacity" denotes being at least higher than the heat capacity of the substrate.

When the heat energy reservoir member absorbs the heat amount generated during the self-cleaning procedure operation, a rise in the temperature of the film deposition unit members inside the film deposition chamber caused by the heat generation effect that accompanies the self-cleaning procedure operation can be ameliorated, and thus, the interval between self-cleaning procedures can be significantly increased due an increase in the permitted integrated film thickness of the silicon-based deposited film of the film deposition unit members that can undergo etching processing at or below the permitted maximum temperature for each of the film deposition unit members inside the film deposition chamber.

Note that if the members facing the plasma, for example, the discharge electrode, the counter electrode, and the heater cover and the like, are used as heat energy reservoir member, the heat accumulation efficiency can be significantly improved because heat accumulation can be carried out at the portions where the heat that accompanies the self-cleaning procedure operation is principally generated. Alternatively, the heat energy reservoir member may be provided in proximity to the electrode cover.

In addition, in the aspect described above, a structure may be used in which, an pre-deposition film deposition operation, in which an pre-deposition film having a high adhesiveness is formed inside the film deposition chamber, is carried out after completing the self-cleaning procedure.

The fluorine and fluorine radicals act on the constituent components at the surface of the film deposition unit members inside the film deposition chamber, and a corrosion layer is thereby formed. This corrosion layer forms due to carrying out self-cleaning procedure, and the film that forms on the surface readily separates from this portion of the corrosion layer. In addition, iron (Fe) component and the chrome (Cr) and aluminum (Al) components and the like adhere to the surface inside the film deposition chamber due to the etching action of the self-cleaning procedure. These components cause the plasma to become unstable when the film deposition process restarts.

According to the present structure, because an pre-deposition film having a high adhesiveness is formed on the surface of the film deposition chamber after the completion of the self-cleaning procedure, the pre-deposition film layer can ameliorate the influence of the corrosion layer and components such as iron, chrome, and aluminum and the like.

Thus, because a silicon-based film that is integrally formed on the pre-deposition film becomes integrated with the pre-deposition film and there is little separation, the time interval between self-cleaning procedures can be significantly lengthened by an equivalent amount. In addition, because the stability of the plasma can be improved, the efficiency of the film deposition operation can be improved.

In this case, it is advantageous for the pre-deposition film to have a thick film thickness, for example, equal to or greater than 200 nm and equal to or less than 300 nm.

When the pre-deposition film layer is less than 200 nm, there is a concern that it will be insufficient to contain the corrosion layer, which gradually forms due to the iron and chrome components and the like that adhere to the surface inside the film deposition layer and due to repeatedly performing self-cleaning procedure. In contrast, when the pre-deposition film thickness exceeds 500 nm for an amorphous silicon film or exceeds 3000 nm for a microcrystalline silicon film, the time taken for the pre-deposition film deposition lengthens, the amount of the integrated film thickness of the film deposition process is limited based on limitations of the integrated film thickness, the film deposition-related operating time shortens, and at the same time, the amount of the integrated film thickness is limited, and the film deposition-related operating time is shortened.

In addition, in the above structure, it is advantageous that the pre-deposition film deposition operation be carried out with a film deposition pressure that is 1.0 to 1.5 times the film deposition pressure during the film deposition process, and, at least during the initial film deposition period, that the high frequency power that is supplied to the discharge electrode be 0.1 to 1.0 times film deposition pressure that is supplied during the film deposition process.

In this manner, the film deposition pressure of the pre-deposition film deposition operation is 1.0 to 1.5 times the film deposition pressure during the film deposition process, and, at least during the initial pre-deposition film deposition period, the high frequency power that is supplied to the discharge electrode is 0.1 to 1.0 times the high frequency power that is supplied during the pre-deposition film deposition process. Thus, an pre-deposition film having a high adhesiveness can be formed inside the film deposition chamber.

When the film deposition pressure is made higher than the film deposition pressure during film deposition process, more film deposition precursors arrive per unit time in comparison to the arrival per unit time during film deposition processing, and thus, the density of the pre-deposition film that has been formed improves. In contrast, when the film deposition pressure is too high, the film deposition rate becomes high, and instead, the denseness is reduced.

In addition, when the high frequency power that is supplied to the discharge electrode is made small in comparison to the high frequency power that is supplied during the film deposition process, the amount that is decomposed by the plasma becomes small, and thus, the deposition of the pre-deposition film proceeds slowly, and the density improves. At less than 0.1 times the high frequency power, the film deposition rate becomes slow, and the time for the pre-deposition film deposition operation becomes long. When the high frequency power is greater than 1.0 times, there is a concern that the film at the initial period, when the pre-deposition film starts to grow, does not become as dense as the film during the film deposition process.

In addition, in the structure described above, it is advantageous to suspend the pre-deposition film deposition operation at least one time and a high vacuum exhaust be performed.

The iron component, the chrome component, and the aluminum component and the like become microparticles and adhere to the surface inside the film deposition chamber due to the etching action of the self-cleaning procedure. At the initial period of the pre-deposition film deposition operation, these iron, chrome, and aluminum components readily float in the plasma singly or after ionizing by reacting with the film deposition gas.

The pre-deposition film deposition operation is suspended at least one time and a high vacuum exhaust is performed. Thus, the floating material inside the film deposition chamber at this point in time can be exhausted to the outside. When the floating material is exhausted to the outside, ionized components such as iron, chrome, and aluminum and the like that are included in the floating matter are also eliminated, and thus, it is possible to suppress these from being mixed in the pre-deposition film that is formed following the suspension of the pre-deposition film deposition operation. In addition, the ionized components such as iron, chrome, and aluminum and the like collect electrons in the plasma, and thereby, the plasma density is not reduced. Thus, an advantageous pre-deposition film can be formed.

Thereby, the implementation interval between self-cleaning procedures can be further lengthened.

Note that a higher number of suspensions during which a high vacuum exhaust is carried out is preferable because more floating material is exhausted from the film deposition chamber to the outside, but considering that the pre-deposition film deposition operation should not be lengthened more than necessary, the five or less suspensions, during which high vacuum exhaust is carried out, are practical.

According to the present invention, because the time interval between self-cleaning procedures is set in a range in which the film deposition-related operating time ratio is saturated with respect to the increase in the film deposition processing amount, for example, the performance time interval can be easily set by providing, for one time, the film deposition-related operating time and the cleaning-related operating time (the self-cleaning procedure time, the self-cleaning procedure preparation operating time, and the pre-deposition film deposition time, which are substantially proportional to the film deposition-related operating time), which is substantially proportional thereto.

In addition, even when the film deposition conditions change, that is, the film deposition-related operating time and the cleaning-related operating time, which is substantially proportional thereto, change, the time interval between self-cleaning procedures can be easily changed, and thus, an advantageous general-use can be provided.

Furthermore, because the time interval between the self-cleaning procedures is set in a range in which the proportion of the film deposition-related operating time is saturated with respect to the increase in the film deposition processing amount, the influence of the self-cleaning procedure operating time on the film deposition-related operating time is small. Thus, because the influence of the self-cleaning procedure operating time becomes small, the production efficiency of the vacuum processing apparatus can be improved.

BRIEF EXPLANATION OF THE SYMBOLS

| | |
|---|---|
| 1 | film deposition chamber |
| 2 | counter electrode |
| 3 | discharge electrode |
| 4 | substrate |
| 6 | electrode cover |
| 17 | heat energy reservoir |
| 32 | pre-deposition film |
| 71 | load chamber |
| 71a | chamber |
| 100 | plasma CVD apparatus |
| Ps | film deposition operating time ratio |
| Tc | cleaning-related operating time |
| Tt | film deposition-related operating time |

BEST MODE FOR CARRYING OUT THE INVENTION

Below, embodiments of the present invention will be explained with reference to the figures.

First Embodiment

A plasma CVD apparatus (vacuum processing apparatus) 100 according to a first embodiment of the present invention will be explained with reference to FIG. 1 to FIG. 4.

Figure 1:
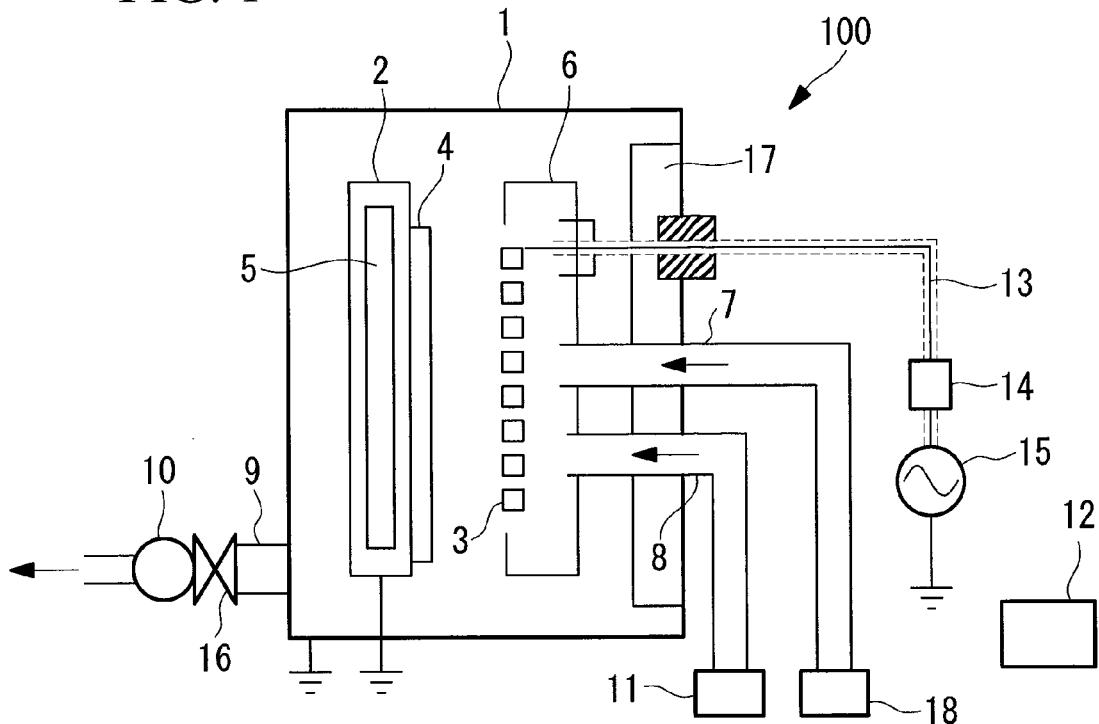
FIG. 1 is a cross-sectional view that shows a general structure of a plasma CVD apparatus according to a first embodiment of the present invention.

FIG. 1 is a cross-sectional view that shows the general structure of a plasma CVD apparatus 100.

The plasma CVD apparatus 100 is provided with a film deposition chamber 1, a heater cover 2, a heater 5, a discharge electrode 3, an electrode cover 6, a source gas feed pipe 7, a cleaning gas feed pipe 8, a gas exhaust pipe 9, a vacuum pump 10, a cleaning gas supply portion 11, a controller 12, a radio frequency energy supplying coaxial cable 13, an impedance matching device 14, a radio frequency power source 15, a pressure regulating valve 16, a hest energy reservoir (hest energy reservoir member) 17, and a source gas supply portion 18.

The film deposition chamber 1 is a vacuum container, and forms a silicon-based thin film layer (an amorphous silicon film or a microcrystalline silicon film) and the like on a substrate 4 therein. Below, an amorphous silicon film and a microcrystalline silicon film are disclosed as a "silicon-based film" when distinguishing between the two is unnecessary.

The heater cover 2 is arranged so as to cover at least the substrate 4 side of the heater 5, and contributes to making the heat distribution of the heater 5 uniform. The heater cover 2 is a conducting plate made of a non-magnetic material equipped with a holding means (not illustrated) that can hold the substrate 4. In consideration of fluorine radical resistance properties, the heater cover 2 is preferably made from a nickel alloy, aluminum, or an aluminum alloy.

The heater cover 2 is grounded and serves as an electrode opposed to the discharge electrode 3.

The heater 5 heats the substrate 4 via the heater cover 2.

When the substrate 4 is arranged in the heater cover 2, a substrate holding means (not illustrated) holds at least a portion of the periphery of the substrate 4, and the position of the substrate 4 is thereby ensured.

The discharge electrode 3 is formed by connecting rod shaped longitudinal electrodes substantially in parallel to form a plane that is substantially parallel to the heater cover 2. The cross-sectional profile of longitudinal electrodes of discharge electrode 3 may be circular or polygonal or the like. In addition, the cross-sectional profile of the longitudinal electrodes may have the shape of a hollow pipe.

The discharge electrode 3 is supplied radio frequency electrical power from the radio frequency power generator 15 by the radio frequency coaxial cable 13, a plasma of a source gas is generated between the discharge electrode 3 and the grounded heater cover 2, and a silicon-based film is formed on the substrate 4.

The electrode cover 6 is provided so as to cover the side of the discharge electrode 3 opposite to the substrate 4.

The impedance matching device 14 matches the impedance of the output side, and transmits the radio frequency electric power to the discharge electrode 3 from the radio frequency power source 15 via the radio frequency coaxial cable 13.

The source gas feed pipe 7 feeds source gases (for example, silane gas ($SiH_4$) and hydrogen gas ($H_2$)) sent from the source gas supply portion 18 into the film deposition chamber 1. At this time, the source gas feed pipe 7 may be connected to the discharge electrode 3, and the source gas may be ejected from inside the discharge electrode 3.

The cleaning gas feed pipe 8 feeds a cleaning gas, for example, nitrogen trifluoride ($NF_3$), that is sent from the cleaning gas supply portion 11 into the film deposition chamber 1.

The vacuum pump 10 is a vacuum pump for high vacuum exhaust, which exhausts the gas inside the film deposition chamber 1. The pressure regulating valve 16 regulates the pressure inside the film deposition chamber 1 by opening and closing the path between the vacuum pump 10 and the film deposition chamber 1, and regulating this amount of opening.

The controller 12 controls the operation of the plasma CVD apparatus 100, such as the control of the flow rate of the source gas (for example, silane gas and hydrogen gas), and the cleaning gas and the like, and starting and ending the generation of the plasma by the radio frequency power source 15.

Next, the film deposition operation of the plasma CVD apparatus according to the present embodiment will be explained.

A substrate 4 is conveyed by using a substrate conveying apparatus (not illustrated) inside the film deposition chamber 1, set on the heater cover 2, and held by a substrate holding fixtures (not illustrated).

Next, the film deposition operation is carried out by the controller 12.

First, the pressure regulating valve 16 is opened, evacuation is carried out by the vacuum pump 10, and the film deposition chamber 1 is set to a predetermined degree of vacuum, such as $10^{-2}$ Pa. In addition, the temperature of the heater 5 is set to 250° C.

Next, silane gas, which serves as a raw material for the silicon-based film, and hydrogen gas are fed from the source gas feed pipe 7 to the film deposition chamber 1, and the film deposition pressure is set to, for example, 85 Pa by the pressure regulating valve 16.

In the case in which an amorphous silicon film is being formed, the ratio of the hydrogen gas flow rate to the silane gas flow rate ($H_2/SiH_4$) is set to a small ratio of 10 or less. In the case in which a microcrystalline silicon film is being formed, the ratio of the hydrogen gas feed rate to the silane gas feed rate is set to a large ratio of 30 or greater.

While the silane gas and the hydrogen gas are being fed to the film deposition chamber 1, under control of the controller 12, the radio frequency power source 15 supplies radio frequency electric power (RF power) to the discharge electrode 3. Plasma is generated between the discharge electrode 3 and the heater cover 2 due to the radio frequency power being supplied to the discharge electrode 3.

The silane gas is decomposed by the generation of this plasma, and a silicon-based film is formed on the surface of the substrate 4.

When the deposition of the film on the substrate 4 has completed, the supply and the like of source gas and radio frequency electric power is stopped. After the inside of the film deposition chamber 1 has been evacuated to a high vacuum, the film deposition chamber 1 is opened, and the substrate 4 is removed by the substrate conveying apparatus (not illustrated). At this point, the operation for one batch is complete.

By repeating the above operation, film deposition on substrates 4 is carried out continuously.

Figure 9:
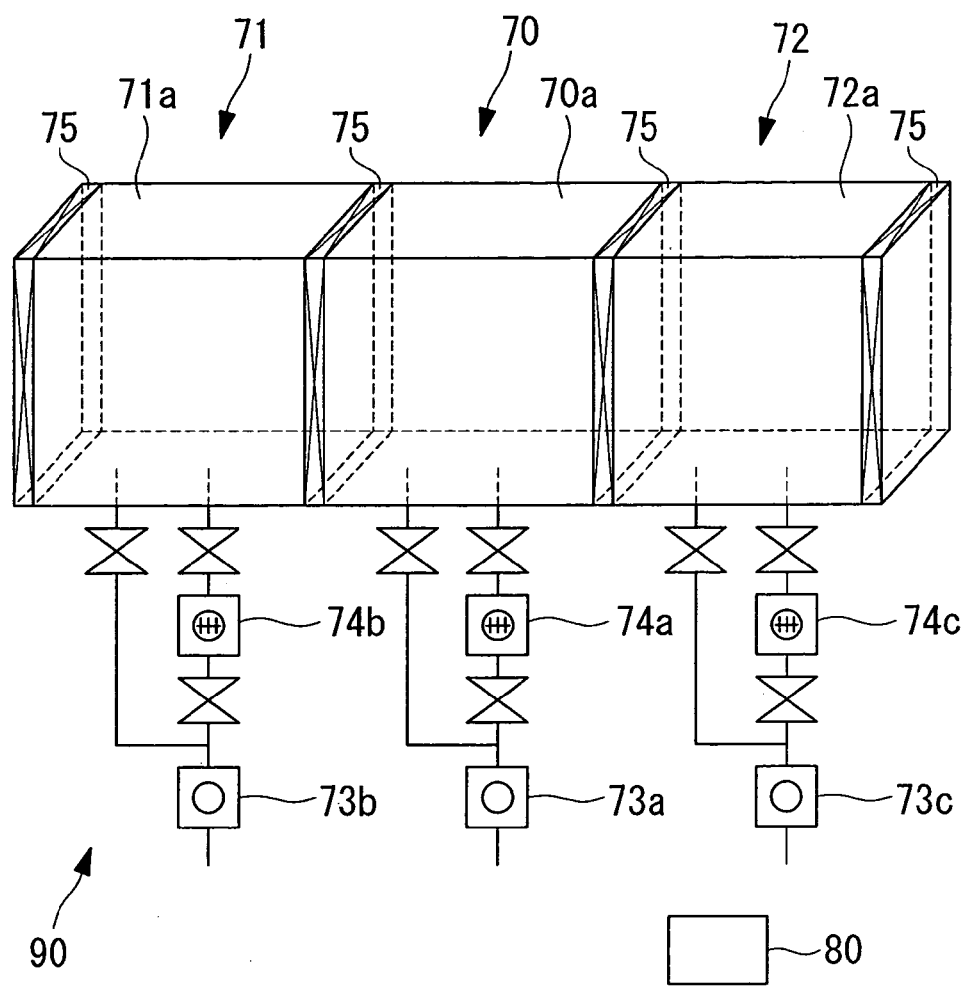
FIG. 9 is a schematic of a thin film manufacturing apparatus.

FIG. 9 shows a thin film manufacturing apparatus (vacuum processing apparatus) 90 that carries out the deposition of a silicon-based film on a glass substrate when a semiconductor such as a silicon solar battery is manufactured. The thin film manufacturing apparatus 90 is provided with a film deposition chamber 70 that maintains a reduced pressure state to enable high quality film deposition processing without the introduction of air; a loading chamber 71 that is connected to the film deposition chamber 70 when a glass substrate in air is conveyed to the film deposition chamber 70 by using a substrate conveying apparatus (not illustrated); and an unloading chamber that coveys the glass substrate out of the film deposition chamber 70. The film deposition chamber 70, the loading chamber 71, and the unloading chamber 72 are respectively provided with chambers 70a, 71a, and 72a, and these chambers 70a, 71a, and 72a are brought to a high vacuum state by being respectively evacuated by the rough vacuum pumps 73a, 73b, and 73c and the turbo-molecular pumps 74a, 74b, and 74c. In addition, each chamber is separated by gate valves 75, and thereby separate pressure settings for each chamber are possible. In addition, the apparatus as a whole is controlled by the control apparatus 80.

At this time, the film deposition time Ts for the substrate 4 is determined by the film deposition rate Vs and the film deposition thickness Ds. Specifically, Ts=Ds/Vs. Other times, including, for example, the conveying time for conveying the substrate 4 in and out, and the time for evacuating the film deposition chamber 1, feeding the source gases, and pressure adjustments and the like comprise the film deposition preparation time Tj.

In the process in which the silicon-based film is formed on the substrate 4, contaminants having silicon as the main constituent undesirably adhere (form a film or deposit) to the inside of the film deposition chamber 1.

Similar to the silicon-based film that is formed on the substrate 4, these contaminants include many hydrogen atoms. When these contaminants becomes thickly deposited, due to, for example, temperature changes during the film deposition process, the contaminants separate and mix into the silicon-based film of the substrate, thereby causing the product quality to deteriorate.

Thus, the removal of contaminants (cleaning) is carried out at appropriate intervals.

In the present embodiment, a cleaning gas is fed instead of the source gas is introduced, and self-cleaning procedure that uses a plasma is performed.

Figure 2:
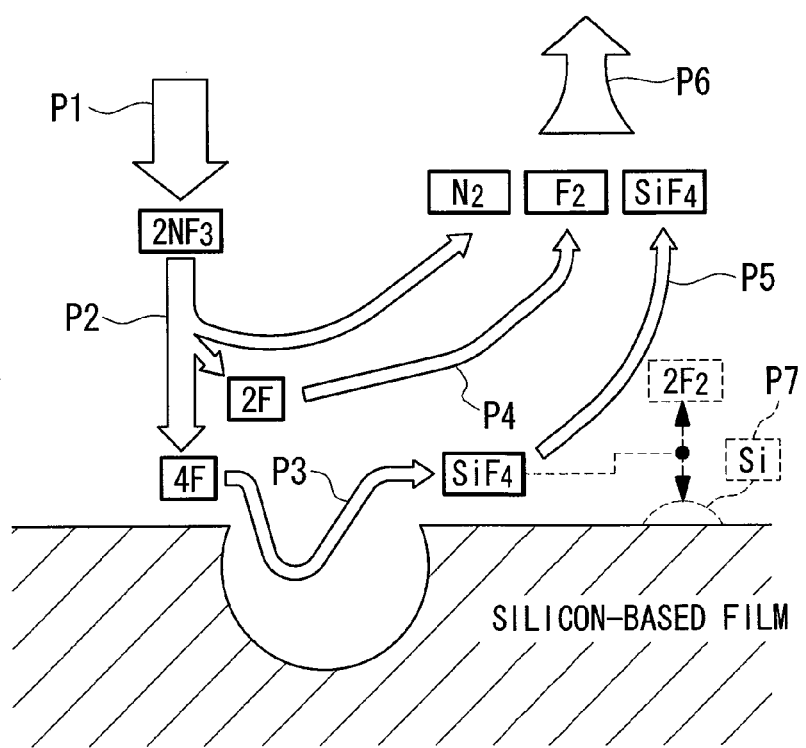
FIG. 2 is a schematic view for explaining the process of self-cleaning procedure according to a first embodiment of the present invention.

The self-cleaning procedure operation of this self-cleaning procedure will be explained with reference to FIG. 2. The self-cleaning procedure operation and the like are carried out by the controller 12.

After the film deposition process has completed and the substrate 4 has been carried out of the film deposition chamber 1, the film deposition chamber 1 is sealed, and while the remaining gases such as the source gases in the film deposition chamber 1 and the exhaust pipe 9 and the like are evacuated by the vacuum pump 10, a cleaning gas (for example, $NF_3$) is fed to the film deposition chamber 1 from the cleaning gas feed pipe 8 (process P1). That is, the gas inside the film deposition chamber 1 is switched from the source gas to the cleaning gas.

At this time, in order to suppress even a little temperature increases inside the film deposition chamber 1 caused by the etching reaction heat due to the cleaning gas, preferably, the power input to the heater 5 is stopped and the heater 5 is made inactive.

When the switching to this cleaning gas has completed, radio frequency power is applied to the discharge electrode 3. A plasma is generated between the discharge electrode 3 and the heater cover 2 due to supplying the radio frequency power to the discharge electrode 3. At this time, in order to stabilize the plasma, a dummy substrate consisting of a material that is not readily corroded by the cleaning gas may be arranged on the heater cover 2.

Due to the generation of this plasma, the supplied $NF_3$ is decomposed into fluorine radicals (F) and nitrogen ($N_2$) (process P2).

The fluorine radicals react with the silicon-based film and powder that has adhered to the inside of the vacuum container 1, and silicon tetrafluoride ($SiF_4$) is generated as a gas (process 3). This means that etching is being carried out.

The reaction formula at this time is the following:

Formula 1

$$\frac{4}{3}NF_3 + Si \Rightarrow \frac{2}{3}N_2 + SiF_4 \qquad [\text{数 1}]$$

A portion of the fluorine radicals do not react and become fluorine ($F_2$) (process P4).

In addition, the generated $SiF_4$ is in a gaseous state, and diffuses (process P5) or stagnates in proximity to the silicon-based film.

Gas species such as nitrogen, fluorine, and $SiF_4$ and the like that are present inside the film deposition chamber 1 are exhausted to the outside of the film deposition chamber 1 by the vacuum pump 10 (process P6).

At this time, the amount of the silicon-based film removed by etching is reduced due to the stagnating $SiF_4$ being decomposed again by the plasma and reattaching to the silicon-based film as silicon (Si) (Process P7)

An etching reaction accompanied by rapid heat generation occurs between the silicon-based film and particles and the cleaning gas (F radicals). This reaction is shown by the following equation (1):

$$4F(\text{radical}) + Si \rightarrow SiF_4 + 1{,}439 \text{ kcal/mol} \tag{1}$$

In this manner, when the contaminants have been removed (that is, self-cleaning procedure in the narrow sense has been completed), the remaining gases such as the cleaning gas inside the film deposition chamber 1 and the exhaust pipe 9 and the like are exhausted by the vacuum pump 10. Subsequently, while source gas is fed from the source gas feed pipe 7, the gas inside the film deposition chamber 1 is exhausted to the outside by the vacuum pump 10. Thereby, the atmosphere of the film deposition chamber 1 is switched to the source gas from the cleaning gas.

At this time, the temperature inside the film deposition chamber 1 rises accompanying the discharge power supplied for the etching reaction and plasma generation during self-cleaning procedure, and the heater cover 2 is cooled to a predetermined temperature so that the portion, excluding the substrate, facing the plasma that has been generated inside the film deposition chamber returns to the temperature state during film deposition. Although allowing natural cooling is typical, a cooling means may be provided to provide forced cooling.

In addition, this cooling means may be operated during the self-cleaning procedure operation to suppress a temperature rise inside the film deposition chamber 1 accompanying the self-cleaning procedure. In this manner, even if there is a large amount of contamination, the temperature inside the film deposition chamber 1 that accompanies self-cleaning procedure can be suppressed to or below a permitted maximum temperature (for example, a temperature that promotes the rapid corrosion of the constituent materials and shortens the service life of the film deposition chamber 1: a temperature of equal to or less than 400° C. is recommended even for a film deposition chamber made of Inconel). Therefore, based on the temperature limitations inside the film deposition chamber 1, the interval between self-cleaning procedures can be lengthened because the permitted integrated film thickness of the silicon-based deposited film that can undergo etching processing increases.

In addition, a portion of the amount of heat that is generated during self-cleaning procedure is deposited in the heat energy reservoir 17, and thus, the temperature rise inside the film deposition chamber 1 can be ameliorated by an equivalent amount. Preferably, the heat energy reservoir 17 is provided on the inner wall surface of the film deposition chamber. However, the heat energy reservoir 17 need not be provided on an inside wall provided that the accumulated heat energy can be readily released to the outside. In addition, preferably, the heat energy reservoir 17 is provided at a position near a location at which the heat is generated, such as the electrode cover 6, so that the heat transfer rate can be increased and the generated heat easily absorbed. In addition, the arrangement of the heat energy reservoir 17 is desirable, but the heat energy reservoir 17 is not always necessary provided that the conditions allow the regulation of temperature rises inside the film deposition chamber 1.

When the self-cleaning procedure has been completed and the temperature of the heater cover 2 has been cooled to a predetermined temperature, power is supplied to the heater 5 to start the temperature control, and at the same time, the atmosphere of the source gas is switched and adjusted to a predetermined temperature. The controller 12 supplies radio frequency power (RF power) to the discharge electrode 3.

A plasma is generated between the discharge electrode 3 and the heater cover 2 due to the radio frequency power being supplied to the discharge electrode 3.

The source gas (silane gas and the like) is decomposed due to the generation of this plasma, and on the surface of the inside of the film deposition chamber 1, a silicon-based pre-deposition film, that is, a pre-deposition layer is formed.

Next, the timing for carrying out this self-cleaning procedure when an amorphous silicon film is formed will be explained.

The number of film deposition processes is denoted by "n batch". After n batches of the film deposition process have completed, self-cleaning procedure is carried out. Where the film deposition thickness for 1 batch is denoted by Fs (nm), the film deposition rate is denoted Dr (nm/minute), and the film deposition preparation time is denoted by a (minutes), the film deposition-related processing time Tt (minutes) is given by equation 2.

Equation 2

$$Tt = n\left(\frac{Fs}{Dr} + a\right) \tag{2}$$

In contrast, when it is assumed that the integrated film thickness subject to the etching process after n batches of film deposition process is substantially equivalent to the integrated film thickness of the substrate 4, then n×Fs (nm). When the etching rate is denoted Er (nm/minute), the total of the self-cleaning procedure preparation time and the pre-deposition film deposition time is denoted b (minutes), then the cleaning-related operating time Tc (minutes) is given by equation 3.

Equation 3

$$Tc = \frac{n \times Fs}{Er} + b \tag{3}$$

When the ratio of the film deposition operating time ratio Ps is set to the proportion of the film deposition-related operating time Tt in the total operating time, which is the result of adding the cleaning-related operating time Tc to the film deposition-related operating time Tt, then the film deposition operating time ratio Ps is given by the following equation:

Equation 4

$$Ps = \frac{Tt}{Tt + Tc} \tag{4}$$
$$= \frac{n \times \left(\frac{Fs}{Dr} + a\right)}{n \times \left(\frac{Fs}{Dr} + a\right) + \left(\frac{n \times Fs}{Er} + b\right)}$$
$$= \frac{\left(\frac{Fs}{Dr} + a\right)}{\left(\frac{Fs}{Dr} + a\right) + \left(\frac{Fs}{Er} + \frac{b}{n}\right)}$$

The important part of this equation is the term (b/n), and the total b (minutes) of the self-cleaning procedure preparation time and the pre-deposition film deposition time can be evaluated after reflecting the influence of the n batches of the film deposition process.

For example, in the conventional evaluation concept, the total b of the film deposition preparation time a, the self-cleaning procedure preparation time, and the pre-deposition film deposition time was not sufficiently considered. That is, the above equation 4 becomes the following equation when a=0 and b=0:

Equation 5

$$Ps = \frac{\left(\frac{Fs}{Dr}\right)}{\left(\frac{Fs}{Dr}\right)+\left(\frac{Fs}{Er}\right)} = \frac{1}{1+\left(\frac{Dr}{Er}\right)}$$

Therefore, a key element of conventional thinking is that the film deposition operating time ratio Ps is determined by (Dr/Er), and thus, the etching rate Er becomes high. Thus, the timing at which self-cleaning procedure is carried out is not evaluated by using the film deposition operating time ratio Ps, but is mainly evaluated by the state of increase in the number of particles during film deposition.

In the first embodiment, the influence of the n batches of the film deposition process during large scale production is reflected by considering the total b of the film deposition preparation time a, the self-cleaning procedure preparation time, and the pre-deposition film deposition time, and the timing at which effective self-cleaning procedure is carried out in production processing can thereby be evaluated.

Furthermore, an explanation will be provided using specific numerical values. Conditions on which the calculation of the timing is based are assumed to be as follows.

The film deposition thickness Fs per batch is 300 nm/batch, the film deposition rate Dr is 1 nm/s, the film deposition preparation time a per batch is 2 minutes, the etching rate Er during self-cleaning procedure is 5 nm/s, and the total time b of the self-cleaning procedure preparation time (gas replacement and the like) and the film deposition time for the pre-deposition film is 60 minutes.

When these are substituted into equation 2, the film deposition-related operating time Tt is 7n minutes.

In contrast, when the film thickness to be processed is assumed to be substantially equal to the film thickness of the substrate 4, that is, n×300 nm, equation 3 yields a cleaning-related operating time Tc of (n+60) minutes.

The proportion of the film deposition-related operating time Tt in the total operating time, which is the result of adding the film deposition-related operating time Tt and the cleaning-related operating time Tc, and the calculated result for the film-deposition operating time ratio (the film deposition-related operating time ratio) Ps are given in the following equation:

Equation 6

$$Ps = \frac{Tt}{Tt+Tc} = \frac{7n}{7n+n+60} = \frac{7n}{8n+60}$$

Here, when n is unbounded, the film deposition operating time ratio Ps is 7/8, that is, 0.875. The film deposition operating time ratio Ps does not exceed 0.875, or in other words, a saturation curve that converges on 0.875 is formed.

Figure 3:
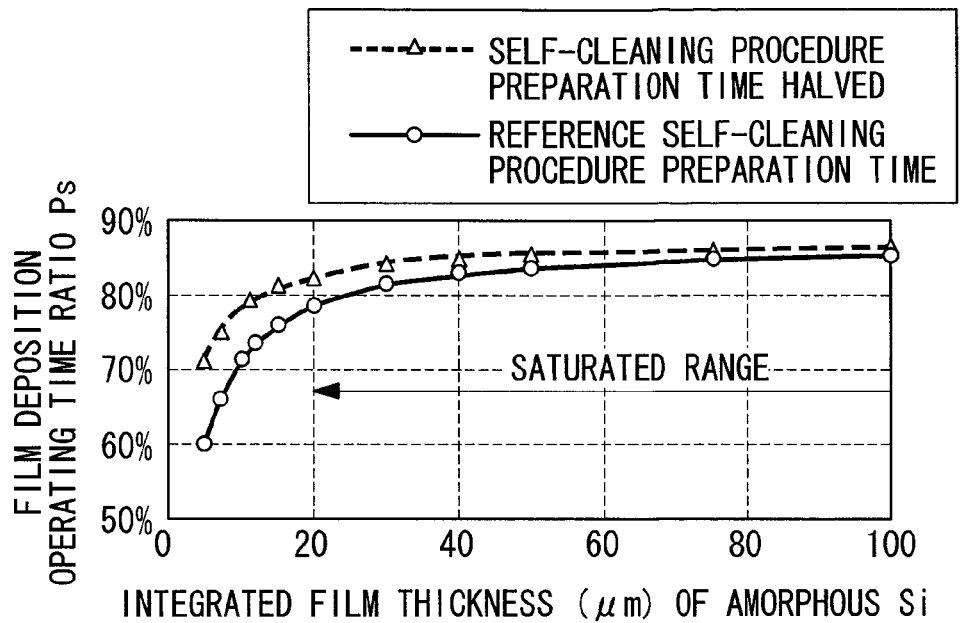
FIG. 3 is a graph that shows the change in the film deposition operating time ratio with respect to the integrated film thickness of an amorphous silicon film according to a first embodiment of the present invention.

FIG. 3 plots the change in the film deposition operating time ratio Ps to the integrated film deposition thickness of an amorphous silicon film.

The circles indicate the case in which the total time b of the self-cleaning procedure preparation time and the film deposition time for the pre-deposition film is, as assumed above, 60 minutes (standard time). The triangles indicate the case in which the etching rate remains the same but the times other than the etching time have been improved, and the total time b of the self-cleaning procedure preparation time and the film deposition time for the pre-deposition film has thereby been reduced by half to 30 minutes (a time reduction of 50%).

Figure 4:
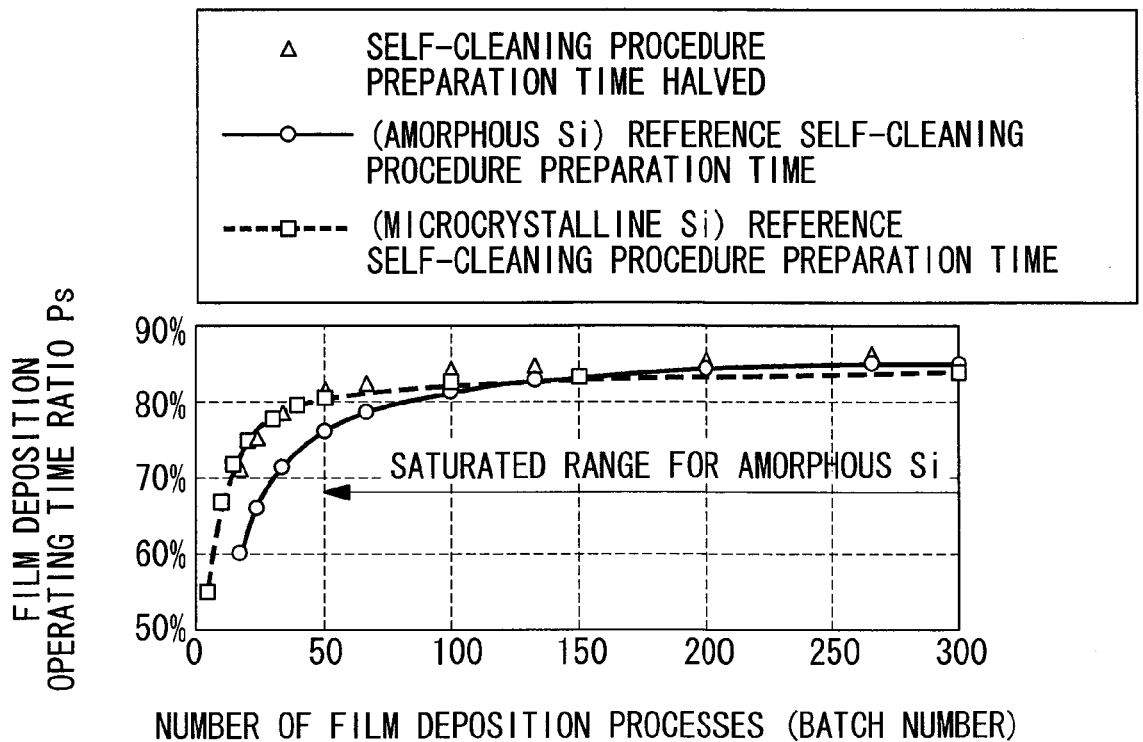
FIG. 4 is a graph that shows the change in the film deposition operating time ratio with respect to batch number of an amorphous silicon film according to a first embodiment of the present invention.

FIG. 4 plots the change in the film deposition operating time ratio Ps for the case in which the integrated film thickness of the amorphous silicon film in FIG. 3 has been changed to a batch number.

The circles indicate the case in which the total time b of the self-cleaning procedure preparation time and the film deposition time for the pre-deposition film is, as assumed above, 60 minutes. The triangles indicate the case in which the etching rate remains the same while times other than the etching time have been improved, and and the total time b of the self-cleaning procedure preparation time and the film deposition time for the pre-deposition film has thereby been reduced by half, to 30 minutes.

According to FIG. 3 and FIG. 4, when the film deposition operating time ratio Ps exceeds 80% (0.8), the film deposition operating time ratio Ps is in a range in which the increase in the integrated film thickness or the batch number is sufficiently saturated. This means that even if the integrated film thickness increases, because the film deposition operating time ratio Ps shows almost no increase, even if the timing at which self-cleaning procedure is carried out deviates slightly, there will be little influence on the film deposition operating time ratio Ps, and a stable production processing can be carried out.

Based on these conditions, the integrated film thickness is unbounded, the convergence value of Ps in equation 4 is equal to or greater than 90%, and in an actual production process, it can be determined that the level is near the limit for obtaining a Ps equal to or greater than this. In addition, because there is little influence on the film deposition operating time ratio Ps due to improvements in the self-cleaning procedure preparation operating time and the like, strict management of the condition selection becomes necessary after conditions have been changed.

In the present embodiment, the time interval between self-cleaning procedures is determined in a range in which the film deposition operating time ratio Ps is saturated with respect to an increase in the integrated film thickness or the batch number.

Thus, because the cleaning-related operating time Tc has almost no influence on the film deposition-related operating time Tt, even if the cleaning-related operating time Tc fluctuates slightly, there is little influence on the film deposition operating time ratio Ps. Therefore, it is possible to increase the production efficiency of the vacuum processing apparatus stably.

Note that in the case of FIG. 3, if a range in which the film deposition operating time ratio Ps exceeds 80% is selected, it is possible to select a high operation state for the timing interval between the amorphous silicon film self-cleaning procedures, in which the film deposition operating time ratio Ps exceeds 90% of the 87.5% that is the saturation value (convergent value). The integrated film thickness of an amorphous silicon film at this time exceeds 20 µm. Similarly, the integrated film thickness of a microcrystalline silicon film exceeds 50 µm.

Also note that because the self-cleaning procedure operation is an exothermic action, considering the influence of temperature rises in the constituent material due to heat generation during the self-cleaning procedure operation and that a thickly deposited silicon-based film readily separates due to temperature differences during the film deposition processing steps, it is advantageous that the integrated film thickness does not exceed, for example, 500 µm while self-cleaning procedure is carried out.

Specifically, for example, when the integrated film thickness exceeds 500 µm, the total of the amount of etching heat generation increases, and thus, in order to process of this amount of heat and the like, additional means, such as increasing the cooling means, become necessary.

In addition, another reason is that when the separation of a silicon-based film occurs due to temperature changes in the film deposition unit members in the interior of the film deposition chamber between the film deposition processes, that is, during the film deposition time and the high vacuum atmosphere time, during which the substrate is transported into and out of a high vacuum atmosphere, the disadvantage of the influence on the film deposition yield increases.

The film deposition operating time ratio Ps can be simply calculated if the conditions described above are given.

In addition, even in the case in which the film deposition conditions and the like change, the timing between self-cleaning procedures can be easily changed, and thus, advantageous general-use characteristics can be provided.

The squares in FIG. 4 indicate the change in the film deposition operating time ratio Ps during the standard preparation time in the case in which a microcrystalline silicon film is formed.

Considering that because, in a microcrystalline silicon film, the film deposition thickness per batch is about 10 times thicker than an amorphous silicon film, while in contrast, the etching rate can be increased to twice that of an amorphous silicon film, as shown in FIG. 4, the film deposition operating time ratio Ps is saturated at a stage at which the number of film deposition process batches is low.

Second Embodiment

Next, the plasma CVD apparatus 100 according to a second embodiment of the present invention will be explained with reference to FIG. 5.

The present embodiment differs from the first embodiment only on the point that the heat capacity (mass×specific heat) of the discharge electrode 3 and the electrode cover 6 is made larger, and thus, here, redundant explanations will be omitted. The other structures are identical, and thus, here, the redundant explanations thereof will be omitted.

Figure 5:
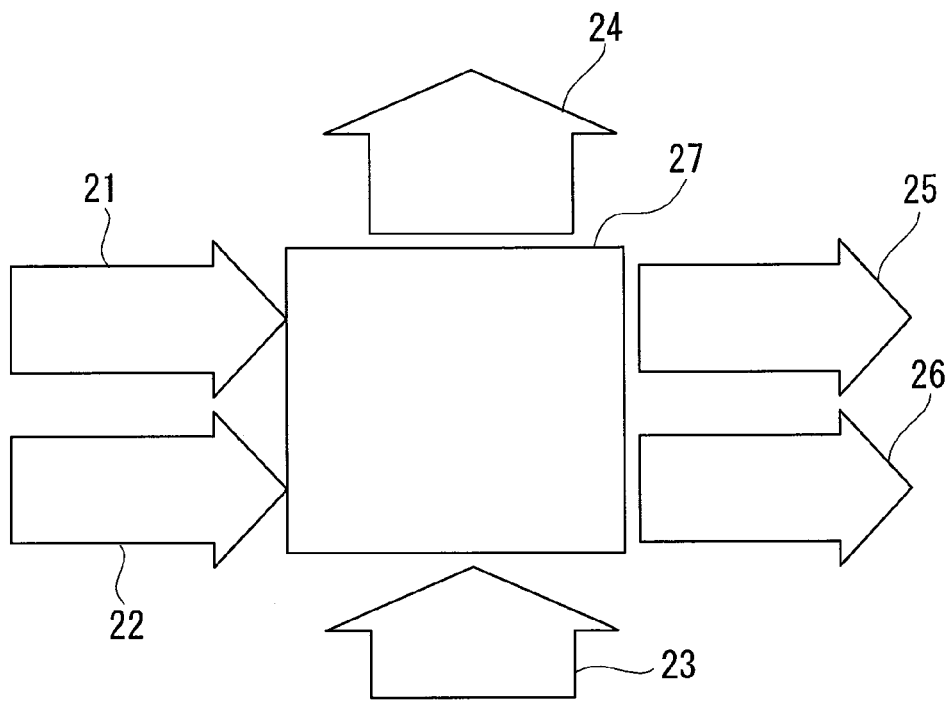
FIG. 5 is a schematic figure that shows the heat amount during balance self-cleaning procedure.

FIG. 5 shows the heat balance inside the film deposition chamber 1 during self-cleaning procedure. The main heat inputs to the film deposition chamber are the heat input 21 of the high frequency power, the generated heat 22 of the heater 5, and the exothermic reaction 23 of the etching. However, there is no need to take into account the heater 5 because it is inactive during the self-cleaning procedure etching time.

In contrast, the output heat from the film deposition chamber 1 consists of the dispersion 24 due to exhaust gas, the dispersion 25 from the chamber walls of the film deposition chamber, and the absorbed heat 26 absorbed by a cooling member. The absorbed heat 26 absorbed by the cooling member is present in the case in which the heat energy reservoir 17 circulates cooling water through an external portion to provide a cooling function. However, the heat transfer surface area of the heat energy reservoir 17 is limited by the structure of the film deposition chamber 1, and thus, and the heat absorption and the cooling effects are not very large.

When the silicon-based film that has deposited on the film deposition unit members inside the film deposition chamber 1 has become thick, due, for example, to a cleaning gas reacting rapidly with the silicon-based film, in the case in which the exothermic reaction 23 of the etching is very large, this heat cannot be compensated for by the dispersion 24 due to the exhaust gas, the dispersion 25 from the chamber walls of the film deposition chamber, and the absorbed heat 26 absorbed by the cooling member. Thus, heat accumulates in, for example, the film deposition unit members of the film deposition chamber 1, and the temperature of each of the film deposition unit members rises.

In the present embodiment, because the heat capacity of the discharge electrode 3 and the electrode cover 6 is made large, the accumulated heat quantity thereof becomes large.

In addition, because the discharge electrode 3 and the electrode cover 6 face the plasma, a silicon-based film is deposited thereon. Thus, the discharge electrode 3 and the electrode cover 6 are the main portions at which the etching exothermic reaction is generated accompanying the self-cleaning procedure operation, and therefore, in the case in which, in these portions, the heat capacity that accumulates heat is large, the heat accumulation efficiency can be significantly improved.

The heat energy reservoir 17 is provided as a heat accumulating member, but the discharge electrode 3 and the electrode cover 6, whose temperature rises during the etching reaction, possess a heat capacity, and thus, they have a heat storing function. Thus, in the case in which the heat generation amount inside the film deposition chamber 1 is small, the heat energy reservoir 17 may be omitted.

Therefore, even if the etching exothermic reaction 23 becomes large in comparison to the dispersion 24 due to the exhaust gas, the dispersion 25 from the chamber walls of the film deposition chamber 1, and the absorbed heat 26 absorbed by a cooling member, the excess quantity of heat can be accumulated by the discharge electrode 3 and the electrode cover 6. The permitted integrated film thickness that can be processed by the etching is limited by the permitted maximum temperature of each of the film deposition unit members, but the increase in the heat capacity due to the discharge electrode 3 and the electrode cover 6 suppresses a rise in temperature inside the film deposition chamber 1, and this contributes to increasing the permitted integrated film thickness.

In this manner, a rise in the temperature inside the film deposition chamber 1 can be suppressed due to the discharge electrode 3 and the electrode cover 6, and thus, it is possible to accommodate a thickening of the integrated processing film and increases in the etching heat generation amount during self-cleaning procedure. Thus, the intervals between self-cleaning procedure can be significantly lengthened.

After the etching reaction has completed, the heat amount that has deposited in the discharge electrode 3 and the electrode cover 6 can be gradually dissipated as dispersion 25 from the chamber walls of the film deposition chamber while the pre-deposition film is being formed or during the film deposition operation on the substrate 4. Thus, a cooling mechanism having a large cooling capacity does not need to be disposed inside the film deposition chamber 1. In addition, during the start of the film deposition on the substrate 4, the temperature inside the film deposition chamber 1 rises depending on the heat amount that accumulates in the discharge electrode 3 and the electrode cover 6, and thus, the heat amount input by the heater 5 can be reduced, and the efficiency of the film deposition operation can be increased.

Preferably, the heat capacities of the discharge electrode 3 and the electrode cover 6 are larger than the heat capacity of the substrate 4.

Specifically, in an apparatus in which the size of the substrate 4 being handled is 1.4 m×1.1 m×4 mm (the substrate mass is 15 kg), the mass of the discharge electrode 3 is 20 kg, and the mass of the electrode cover 6 is 70 kg.

At this time, the heat capacity of the substrate 4 is equal to the substrate mass×specific heat=15×0.837=12.56 kJ/K, and the heat capacity of the discharge electrode 3 and the electrode cover 6=mass (discharge electrode 3+electrode cover 6)×specific heat=90×0.444=39.96 kJ/K. Thus, the discharge electrode 3 and the electrode cover 6 ensure the necessary accumulated heat amount.

A large accumulated heat amount is desirable, but when the rise and fall of the temperature when the operation of the apparatus is started and stopped are taken into consideration, they are in balance with the heating/cooling mechanism capacity provided to the film deposition chamber 1, but this one-time or greater than the substrate mass×the specific heat, which is the heat capacity of the substrate 4, and preferably a target is about 10 to 20 times.

Third Embodiment

Next, the plasma CVD apparatus 100 according to a third embodiment of the present invention will be explained with reference to FIG. 6 to FIG. 8.

The present embodiment differs from the first embodiment only on the point that the film deposition thickness of the pre-deposition film, which is the pre-deposition layer, is formed so as to be comparatively thick. The other structures are identical, and here, the redundant explanations thereof are omitted.

Figure 7:
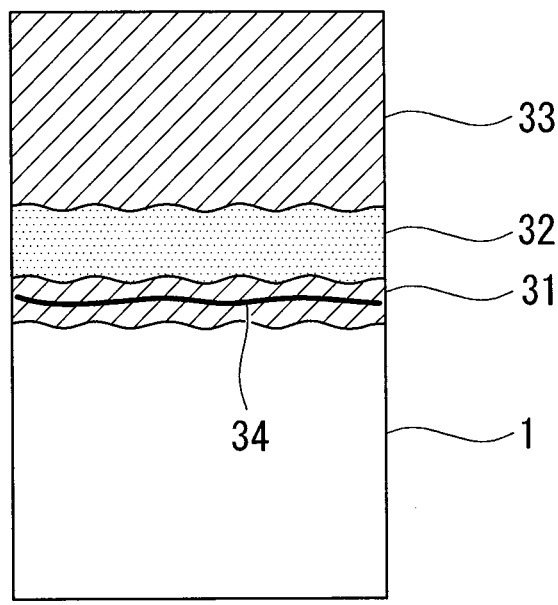
FIG. 7 is a cross-sectional view in which a portion of the interior of the film deposition chamber according to the third embodiment of the present invention has been removed.

FIG. 7 shows a cross-sectional view in which a portion of the inside of the film deposition chamber has been removed. Among the constituents of the film deposition chamber 1, for example, a corrosion layer (FeF$_2$, CrF$_2$ and the like), due to a reaction between an iron component and a chrome component in the constituent material, is produced on the surface of constituents made of a stainless steel material, and this corrosion layer 31 grows to several 10 μms due to the repetition of the self-cleaning procedure.

After the self-cleaning procedure has completed, a pre-deposition film 32 is formed on this corrosion layer 31, and thereon, contaminants 33 that accompany the film deposition operation on the substrate 4 are formed or deposited.

Figure 6:
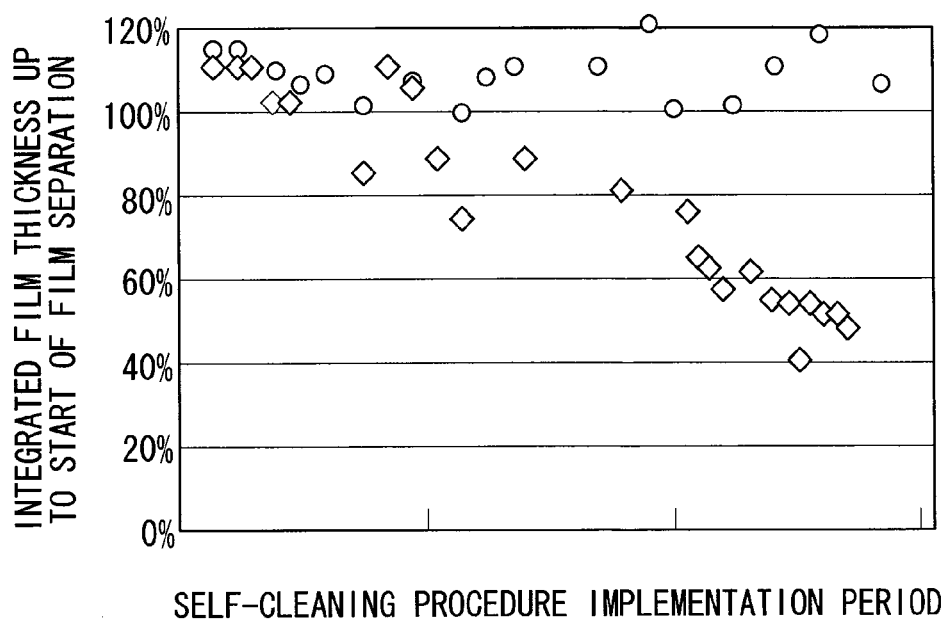
FIG. 6 is a graph that plots the integrated film thickness up to the point in time that contaminants and the pre-deposition film separate depending on the quality of the pre-deposition film according to the third embodiment of the present invention.

FIG. 6 is a plot of the integrated film thickness with respect to the implementation time of the self-cleaning procedure, up to the point in time that, depending on the quality of the pre-deposition film 32 that has been formed on this corrosion layer 31, the contaminants 33 and the pre-deposition film 32 are detached from, for example, the discharge electrode 3 and start to adhere to the substrate 4. Note that the vertical axis is a relative notation in which 30 μm is set to 100%.

The circles in FIG. 6 shows where the pre-deposition film 32 is sufficiently thick and advantageously formed, and the diamonds show where the deposition for the pre-deposition layer 32 is defective.

Viewing FIG. 6, an advantageous pre-deposition layer 32 maintains the standard of a substantially constant integrated film thickness irrespective of the self-cleaning procedure implementation time.

In contrast, a defective pre-deposition film 32 readily separates due to the influence of the selection conditions and the like. It has been determined that the integrated film thickness will decrease up to the point in time that a defective pre-deposition film 32 separates as the number of self-cleaning procedures after chamber release maintenance increases. Specifically, it has been determined that in the case in which the film deposition of the pre-deposition film 32 on the corrosion layer 31, which has been produced on surfaces of the film deposition unit members such as the discharge electrode 3 inside the film deposition chamber, is thin, the thermal expansion interference between the pre-deposition film 32 and the contaminants 33 becomes insufficient, separating portions 34 are produced on a fragile corrosion layer 31, and these readily separate. In addition, it has been determined that in the case in which the density of the pre-deposition film 32 is low, the film itself readily separate.

Thus, in the present embodiment, the pre-deposition film 32 is formed on a thick layer of 200 nm or greater, and the maximum is 500 nm or less for an amorphous silicon film and 3000 nm or less for a microcrystalline silicon film. At these thicknesses, the film thickness per batch is easily controlled during film deposition processing. Thereby, a pre-deposition film 32 having a high adhesion to the film deposition unit member surfaces inside the film deposition chamber 1 will be formed.

Figure 8:
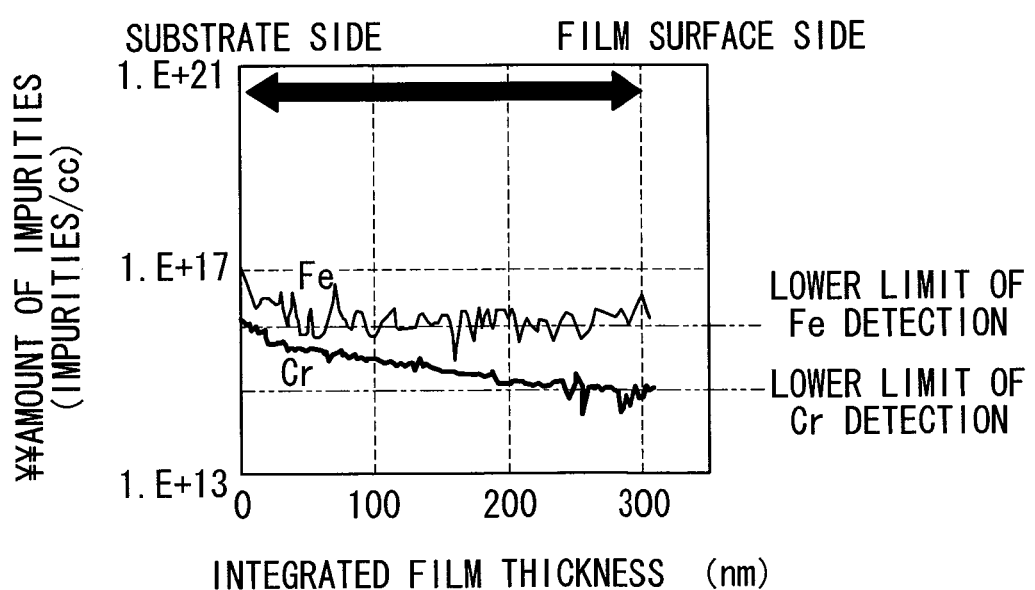
FIG. 8 shows the presence of iron and chrome components and fluorine incorporated during film deposition in the substrate in the film thickness direction.

FIG. 8 shows the presence of iron and chrome incorporated during film deposition in the substrate in the direction of the film thickness. Viewing this figure, it can be understood that in order to trap the iron and chrome components that have attached to the surface of the film deposition unit members inside the film deposition chamber 1 during self-cleaning procedure, a film thickness of 200 nm or greater is necessary.

Contrariwise, as film thicknesses per batch during the film deposition, when the film thickness of an amorphous silicon film exceeds 500 nm in (or 3000 nm for a microcrystalline silicon film), time is necessary for the film deposition operation of the pre-deposition film 32, and the self-cleaning procedure processing time lengthens. At the same time, due to the reduction in the upper limiting value of the integrated film deposition processing that can undergo film deposition processing based on the limit of the maximum integrated film thickness up to the point in time that the next self-cleaning procedure is implemented, the film deposition operating time ratio Ps is undesirably reduced.

Fourth Embodiment

Next, a plasma CVD apparatus 100 according to a fourth embodiment of the present invention will be explained with reference to FIG. 6 and TABLE 1.

The present invention differs from the first embodiment only on the point that film deposition is carried out after changing the film deposition conditions for the pre-deposition film 32. The other structures thereof are identical, and thus, here the redundant explanations are omitted.

In the present embodiment, the film deposition of the pre-deposition film 32 is carried out using the film deposition conditions shown in TABLE 1.

TABLE 1

| Item | | SiH4/H2 (SLM) | Pressure (Pa) | RF Power (W/cm2) | Substrate heater temperature (° C.) |
|---|---|---|---|---|---|
| Pre-deposition film deposition conditions | Step1 | 6/30 | 90 | 0.05 | 250 |
| | Step2 | 6/30 | 90 | 0.06 | 250 |
| | Step3 | 6/30 | 90 | 0.06 | 250 |
| Amorphous Si (i layer) film deposition conditions | — | 5/30 | 85 | 0.09 | 250 |
| Comparison of pre-deposition film deposition conditions and amorphous Si (i layer) film deposition conditions | — | | 90/85 = 1.06 | 0.05/0.09 = 0.56<br>0.06/0.09 = 0.67 | |

The film deposition of the pre-deposition film 32 is carried out by being divided into the three steps Step 1 to Step 3.

During the deposition of an amorphous silicon film on a substrate 4, the film deposition pressure for each of the steps is set to 90 Pa, which is 1.06 times 85 Pa.

In addition, in step 1, the radio frequency power (RF power) is set to 0.05 W/cm$^2$, which is 0.56 times the 0.09 W/cm$^2$, during the deposition of an amorphous silicon film on the substrate 4, and in Step 2 and Step 3, the radio frequency power is set to 0.06 W/cm$^2$, which is 0.67 times.

In this manner, in Step 1 is an initial deposition step up to the deposition of at least a film thickness of substantially $\frac{1}{10}$ or greater than that of the pre-deposition film. When the film deposition pressure is made equal to or higher than the pressure during the film deposition process, more film deposition precursors arrive per unit of time than that of during the film deposition process, and thus, the density of the pre-deposition film 32 that has been formed increases.

In addition, when the radio frequency power that is supplied to the discharge electrode 3 is made equal to or smaller than that during film deposition processing, the amount of film that is decomposed by the plasma is reduced, and thus, the deposition of the pre-deposition film is carried out slowly, and the density increases.

A device having the pre-deposition film 32 that has been formed in this manner behaves similarly to a device having the advantageous film deposition for the pre-deposition film 32 that is shown in FIG. 6, and maintains a level of a substantially constant integrated film thickness irrespectively of the self-cleaning procedure implementation interval.

Note that when the film deposition pressure is much too high, the film deposition rate becomes very high and, unlike the above case, the density of the pre-deposition film is reduced. Therefore, the film deposition rate is desirably limited to up to 1.5 times.

In addition, when the radio frequency power that is supplied to the discharge electrode 3 is less than 0.1 times, the film deposition rate becomes slow, and the time for the underlying (pre-deposition film) film deposition operation lengthens. In contrast, when the radio frequency power is 1.0 times as large, there is a concern that the initial film of the pre-deposition film will not become as dense as a film that has undergone film deposition processing. Thus, desirably this is limited to up to 0.1 to 1.0 times.

Furthermore, preferably, in at least step 1 of the pre-deposition film 32, in order to form a dense film reliably, desirably the film deposition pressure is 1.0 to 1.2 times that during the film deposition process and the radio frequency power is implemented at 0.4 to 0.9 times that during the film deposition process.

In addition, in the present embodiment, the deposition of the pre-deposition film is carried out after being divided into three steps: Step 1 to Step 3. In the middle of each of these Steps, high vacuum exhaust is carried out by a vacuum pump 10.

Due to the etching action of the self-cleaning procedure, micro-particles, including an iron component and a chrome component that have become separated from the constituent material due to a reaction with fluorine and fluorine radicals, adhere to the surface of the film deposition unit members inside the film deposition chamber 1. At the initial stage of the film deposition operation for the pre-deposition film 32, the micro-particles that include the iron and chrome readily float in the plasma singly or after ionizing due to reacting with a film deposition gas.

According to the present embodiment, high vacuum exhaust is carried out using the vacuum pump 10 between Step 1 and Step 2, and between Step 2 and Step 3. Specifically, during the film deposition operation for the pre-deposition film 32, the film deposition operation is interrupted, and a high vacuum exhaust is carried out two times. In the present embodiment, as shown in FIG. 9, the high vacuum exhaust is not switched to the turbo-molecular pump 74a, but evacuation is carried out to 1 Pa to 5 Pa or less, which is the vacuum that can be drawn in a comparatively short time using the rough vacuum pump 73a while maintaining as-is the vacuum exhaust system during film deposition.

Due to this high vacuum exhaust, the floating matter that is floating inside the film deposition chamber 1 at this time can be exhausted to the outside.

When the floating matter is exhausted to the outside, the ionized iron and chrome components and the like that are included therein are also removed, and thus, the incorporation of these into the pre-deposition film 32 that has been formed can be suppressed.

In addition, because the plasma density is not reduced due to ionized iron, chrome, and aluminum components and the like gathering electrons in the plasma, an advantageous pre-deposition film 32 can be formed.

Thereby, the timing interval between self-cleaning procedures can be made significantly longer.

Note that when considering that the film deposition operation for the pre-deposition film 32 should not be extended any more than necessary, five suspensions during which vacuum exhaust is carried out is practical.

Fifth Embodiment

Next, a plasma CVD apparatus 100 according to a fifth embodiment will be explained.

The present embodiment differs from that of the first embodiment only on the point that the surfaces of each of the film deposition units, such as the discharge electrode 3, the heater cover 2, and the electrode cover 6 and the like inside the film deposition chamber 1, are blast processed, and the surface roughness thereof is adjusted so as to be within a predetermined range. The other structures are identical, and thus, the redundant explanation thereof will be omitted.

In the present embodiment, the surfaces inside the film deposition chamber are blast processed so as to attain a surface roughness in which the ten point average roughness is 0.1 μm or greater and 5 μm or less, and the maximum height is a surface roughness that is 10 μm or less.

Japanese Unexamined Patent Application, First Publication No. 2002-93719, discloses that suppressing the surface rate increase of the surfaces inside the film deposition chamber 1 (such as the discharge electrode 3), which is due to irregularities caused by blast processing, to 1.1 to 4 is effective in simultaneously suppressing the film separation and corrosion. In the present embodiment, an examination of the selected range, in which the surface machining profile was made more specific, was carried out.

In contrast, a corrosion layer ($FeF_2$ and $CrF_2$) due to the iron component and the chrome component was generated on these film deposition unit members by self-cleaning procedure on the surface of, for example, a stainless steel material, and this corrosion layer grew to several 10 μms by repeating self-cleaning procedure.

The irregularities in the original surface of the inside of the film deposition chamber 1 are important for the anchoring effect that prevents the adhering film from detaching, but because the pre-deposition film forms on the surface of a corrosion film, it has been determined that no more than a sufficient amount of irregularities of the surface inside the film deposition chamber 1 is necessary.

Thus, the surfaces of the film deposition units inside the film deposition chamber 1 undergo a blast machining equivalent to #100 to 300 blast processing. The surface roughness at this time had a ten point mean roughness Rz=0.1 μm to 5 μm, and a maximum height Ry=10 μm or less.

In the surface profile of these film deposition unit members, a corrosion layer in which fluorine acts on the constituent components of the film deposition unit members inside the film deposition chamber 1 rapidly grows over all of the microscopic convex portions of the surfaces of the film deposition unit members, and the microscopic convex portions quickly detach. Thereby, the early detachment of the corrosion layer can be suppressed.

As a result of observing film deposition unit members whose surfaces had different irregularity profiles, when the roughness of the surface of the film deposition unit members was equal to or greater than 5 μm, at an early stage during the advance of the corrosion, the microscopic convex profile overall grew on the corrosion layer, and the microscopic convex portions readily detached, and the corrosion speed appeared to be fast. In addition, when the roughness of the surfaces of the film deposition unit members was equal to or less than 0.1 μm, the anchoring effect for forming the underlying film (pre-deposition film) was reduced, and it was observed that the pre-deposition film easily detached. In addition, machining the surface of the film deposition unit members such that the ten point mean roughness (Rz) was equal to or greater than 1 μm and equal to or less than 5 μm and the maximum height was equal to or less than 10 μm was more preferable in terms of preventing the corrosion layer from detaching and the pre-deposition film layer from separating.

In this manner, when a surface having roughness is used, the corrosion layer that has grown on the surface detaches with difficulty, and the growth and separation of this corrosion layer itself can be suppressed. Additionally, the service life of the film deposition unit members inside the film deposition unit is extended, and the maintenance costs can be reduced. At the same time, the time interval between self-cleaning procedures can be significantly increased, the processing capacity of the film deposition apparatus is improved, and the production quantities can be increased.

Note that the present invention is not limited by the embodiments described above, and suitable modifications can be made in a range that does not depart from the spirit of the invention.

For example, when each of the embodiments are combined together and implemented, they are even more significantly effective. In addition, the cleaning gas is not limited to $NF_3$ gas, and the same effect can be obtained by using various types of F and Cl based gases, such as $CF_4$ gas, $SF_6$ gas, and $CCl_4$ gas, and the like.

The invention claimed is:

1. An operating method for a vacuum processing apparatus that carries out self-cleaning procedures, at a timing interval, of feeding a cleaning gas into a film deposition chamber in which a film deposition processing is carried out on a substrate, the method comprising:
    a step of determining the timing interval between the self-cleaning procedures so as to be in a range in which a film deposition operating time ratio is 80% or more, where the film deposition operating time ratio is a proportion of a film deposition-related operating time in a sum of the film deposition-related operating time and a cleaning-related operating time; and
    a step of implementing the self-cleaning procedures at the timing interval determined in the step of determining the timing interval,
    wherein the film deposition-related operating time includes a film deposition time and a film deposition preparation time, and
    the cleaning-related operating time includes a self-cleaning procedure time, a self-cleaning procedure preparation time, and a pre-deposition film deposition time.

2. The operating method for a vacuum processing apparatus according to claim 1, wherein the timing interval is determined so as to be in a range in which the film deposition operating time ratio exceeds 90% of a convergence value thereof.

3. The operating method for a vacuum processing apparatus according to claim 1, further comprising a step of accumulating a heat amount generated during operations of the self-cleaning procedures by using a high heat capacity heat energy reservoir member that is arranged in an interior of the film deposition chamber.

4. The operating method for a vacuum processing apparatus according to claim 1, further comprising a step of carrying out a pre-deposition film deposition operation that forms a pre-deposition film in the film deposition chamber after the self-cleaning procedures are completed.

5. The operating method for a vacuum processing apparatus according to claim 4, wherein in the step of carrying out the pre-deposition film deposition operation, a film deposition pressure is equal to or greater than 1.0 times and equal to or less than 1.5 times a film deposition pressure during the film deposition processing, and at least during an initial film deposition period, a radio frequency power supplied to a discharge electrode is equal to or greater than 0.1 times and equal to or less than 1.0 times a radio frequency power supplied during the film deposition processing.

6. The operating method for a vacuum processing apparatus according to claim 4, further comprising a step of suspending at least one time the pre-deposition film deposition operation and carrying out a high vacuum exhaust step.

* * * * *